US012719232B2

(12) United States Patent
Take

(10) Patent No.: US 12,719,232 B2
(45) Date of Patent: Aug. 25, 2026

(54) SEMICONDUCTOR DEVICE

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventor: Naoya Take, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 877 days.

(21) Appl. No.: 17/974,850

(22) Filed: Oct. 27, 2022

(65) Prior Publication Data

US 2023/0138210 A1 May 4, 2023

(30) Foreign Application Priority Data

Nov. 4, 2021 (JP) ................................ 2021-180543

(51) Int. Cl.
*H10W 72/30* (2026.01)
*H01S 5/02315* (2021.01)
(Continued)

(52) U.S. Cl.
CPC ........ *H01S 5/0237* (2021.01); *H01S 5/02315* (2021.01); *H01S 5/02345* (2021.01);
(Continued)

(58) Field of Classification Search
CPC ... H01S 5/0237; H01S 5/02345; H01L 24/32; H01L 24/29; H01L 24/48;
(Continued)

(56) References Cited

U.S. PATENT DOCUMENTS

2003/0092326 A1* 5/2003 Nishikawa ............ H01L 21/563
257/E21.511
2004/0097017 A1* 5/2004 Shimanuki .............. H01L 24/49
438/102

(Continued)

FOREIGN PATENT DOCUMENTS

JP 2536431 B 9/1996
JP 4458997 B2 4/2010

(Continued)

OTHER PUBLICATIONS

Translation for JP2019110203A (Year: 2019).*

*Primary Examiner* — Tod T Van Roy
*Assistant Examiner* — Hunter Jared Nelson
(74) *Attorney, Agent, or Firm* — Posz Law Group, PLC

(57) ABSTRACT

A semiconductor device includes a semiconductor element, a substrate, and a plurality of wires. The semiconductor element has a plurality of electrodes on a first surface. The substrate has an element mount portion to which a second surface of the semiconductor element is joined through a solder joining material, a plurality of bonding portions disposed on a periphery of the element mount portion and spaced apart from each other, and a solder absorption portion extending outwardly from the element mount portion to receive a surplus of the solder joining material and being electrically independent of the plurality of bonding portions. The wires connect the electrodes and the bonding portions. The element mount portion and the solder absorption portion have a higher solder wettability than another portion of the substrate.

10 Claims, 14 Drawing Sheets

(51) Int. Cl.

| | |
|---|---|
| ***H01S 5/02345*** | (2021.01) |
| ***H01S 5/0237*** | (2021.01) |
| *H10W 72/00* | (2026.01) |
| *H10W 90/00* | (2026.01) |

(52) U.S. Cl.
CPC ........ *H10W 72/884* (2026.01); *H10W 90/734* (2026.01); *H10W 90/754* (2026.01)

(58) Field of Classification Search
CPC . H01L 2224/32227; H01L 2224/48227; H01L 2224/73265
See application file for complete search history.

(56) References Cited

U.S. PATENT DOCUMENTS

2010/0252938 A1* 10/2010 Ozawa ................ H01L 25/0657 257/778
2016/0225701 A1 8/2016 Tanaka
2018/0197822 A1* 7/2018 Sawamoto ............ H01L 23/552
2021/0159664 A1* 5/2021 Liu ..................... H01S 5/02255

FOREIGN PATENT DOCUMENTS

JP 2010-165990 A 7/2010
JP 4780933 B2 9/2011
JP 2019110203 A * 7/2019 ........... H10H 20/831

* cited by examiner

SEMICONDUCTOR DEVICE

CROSS REFERENCE TO RELATED APPLICATION

The present application claims the benefit of priority from Japanese Patent Application No. 2021-180543 filed on Nov. 4, 2021. The entire disclosures of the above application are incorporated herein by reference.

TECHNICAL FIELD

The present disclosure relates to a semiconductor device in which a semiconductor element is mounted on a substrate via a joining material.

BACKGROUND

It has been known a semiconductor device in which a semiconductor element is mounted on a circuit board via a joining material containing a solder as a main component, and the semiconductor element is connected to the circuit board through wires. In such a semiconductor device, if the amount of joining material is excessive, the joining material may overflow to portions of the circuit board to which the wires are connected, resulting in a short circuit.

SUMMARY

The present disclosure describes a semiconductor device in which a semiconductor element is mounted on a mount member via a joining material, and is connected to the mount member through wires.

BRIEF DESCRIPTION OF THE DRAWINGS

Objects, features and advantages of the present disclosure will become more apparent from the following detailed description made with reference to the accompanying drawings, in which.

DETAILED DESCRIPTION

Figure 1:
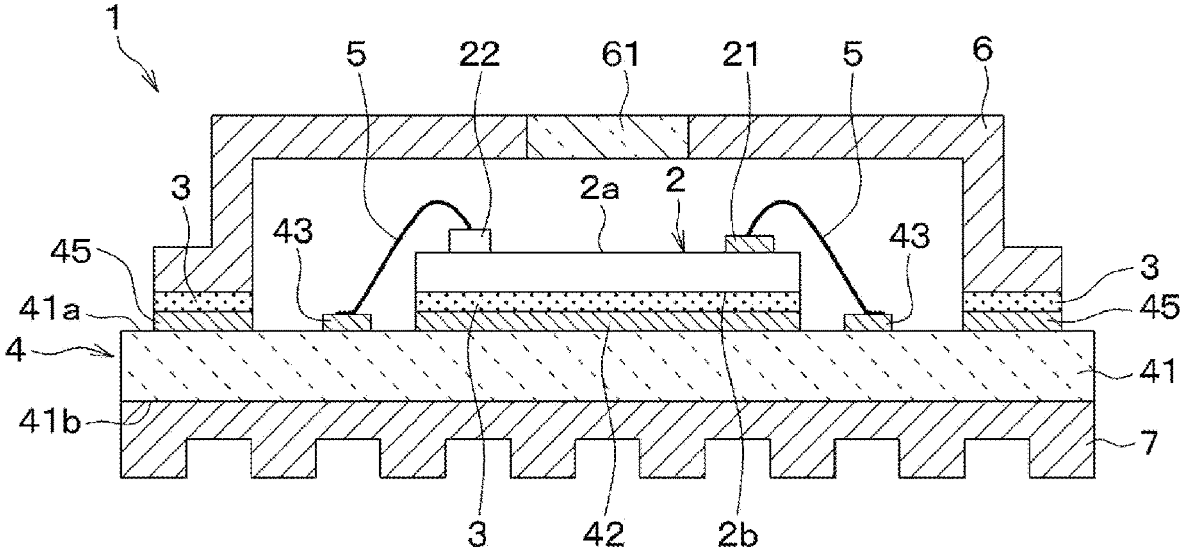
FIG. 1 is a cross-sectional view of a semiconductor device according to a first embodiment.

To begin with, a relevant technology will be described only for understanding the embodiments of the present disclosure. In a semiconductor device, for example, a semiconductor element is mounted on a circuit board through a joining material containing a solder as a main component. The semiconductor element is also connected to the circuit board through wires. In such a semiconductor device, if the amount of the joining material is excessive, the joining material may overflow to portions of the circuit board to which the wires are connected, resulting in a short circuit. In order to suppress such a short circuit, a following configuration may be conceivable.

For example, a circuit board may have an element mount portion on which a semiconductor element is mounted and a protruded portion on a periphery of the element mount portion. The semiconductor element may be joined to the element mount portion via a solder as a joining material. The protruded portion may be higher than an upper surface of the semiconductor element and surrounds the element mount portion. In such a semiconductor device, the protruded portion may block a surplus of the joining material, so a short circuit can be suppressed. However, if wires connected to the semiconductor element are connected to portions of the circuit board outside the protruded portion, the length of the wires is likely to increase. In order to reduce the length of the wires, it may be conceivable to form grooves in the protruded portion to allow the wires to pass through. In such a configuration, however, additional processing is necessary, resulting in an increase in manufacturing costs.

As another method for suppressing a short circuit caused by the overflow of the surplus of the joining material, it may be conceivable to form a recess inside a mount area on which the semiconductor element is to be mounted in the circuit board, and to join the semiconductor element to the circuit board via a solder arranged in the recess. In such a method, however, the thickness of the solder is likely to increase. As a result, a thermal resistance between the semiconductor element and the circuit board is likely to increase, and heat dissipation of the semiconductor element is likely to deteriorate.

The present disclosure provides a semiconductor device, which is capable of suppressing a short circuit caused by an overflow of a joining material, as well as suppressing an increase in length of a wire and an increase in thermal resistance.

According to an aspect of the present disclosure, a semiconductor device includes a semiconductor element, a substrate, and a plurality of wires. The semiconductor element has a first surface and a second surface opposite to the first surface. The semiconductor element includes a plurality of electrodes on the first surface. The substrate has an element mount portion, a plurality of bonding portions, and a solder absorption portion. The semiconductor element is mounted on the element mount portion so that the second surface of the semiconductor element is joined to the element mount portion through a solder joining material. The plurality of bonding portions are arranged spaced apart from each other on a periphery of the element mount portion. The solder absorbing potion extends outwardly from the element mount portion to allow a surplus of the solder joining material to flow in and is electrically independent of the bonding portions. The wires connect the electrodes of the semiconductor element and the bonding portions. Further, the element mount portion and the solder absorption portion have a solder wettability higher than another portion of the substrate.

In such a configuration, the substrate has the element mount portion on which the semiconductor element is mounted, the bonding portions connected to the semiconductor element through the wires, and the solder absorption portion extending from the element mount portion. The semiconductor element is mounted on the element mount portion through the solder joining material. The solder absorption portion is electrically independent of the bonding portions and has the higher solder wettability than another portion of the substrate. Therefore, even if the amount of the solder joining material is excessive, a surplus of the solder joining material can flow to the solder absorption portion, which has the higher solder wettability than the other portion of the substrate. Therefore, it is less likely that the surplus of the solder joining material will contact the bonding portions. As a result, a short circuit due to the surplus of the solder joining material can be suppressed. Further, since the solder absorption portion is extended from the element mount portion, it is not necessary to form a protruded portion for blocking an overflowing solder joining material between the element mount portion and the bonding portions. Also, it is less likely that the thickness of the solder joining material will increase. Accordingly, in the semiconductor device described above, a short circuit due to overflowing of the surplus of the solder joining material is suppressed, as well as an increase in the length of the wires and an increase thermal resistance can be suppressed.

Embodiments of the present disclosure will be described hereinafter with reference to the drawings. In the embodiments described hereinafter, the same or equivalent parts are denoted by the same reference numerals.

First Embodiment

A semiconductor device 1 according to a first embodiment will be described with reference to the drawings.

Figure 4:
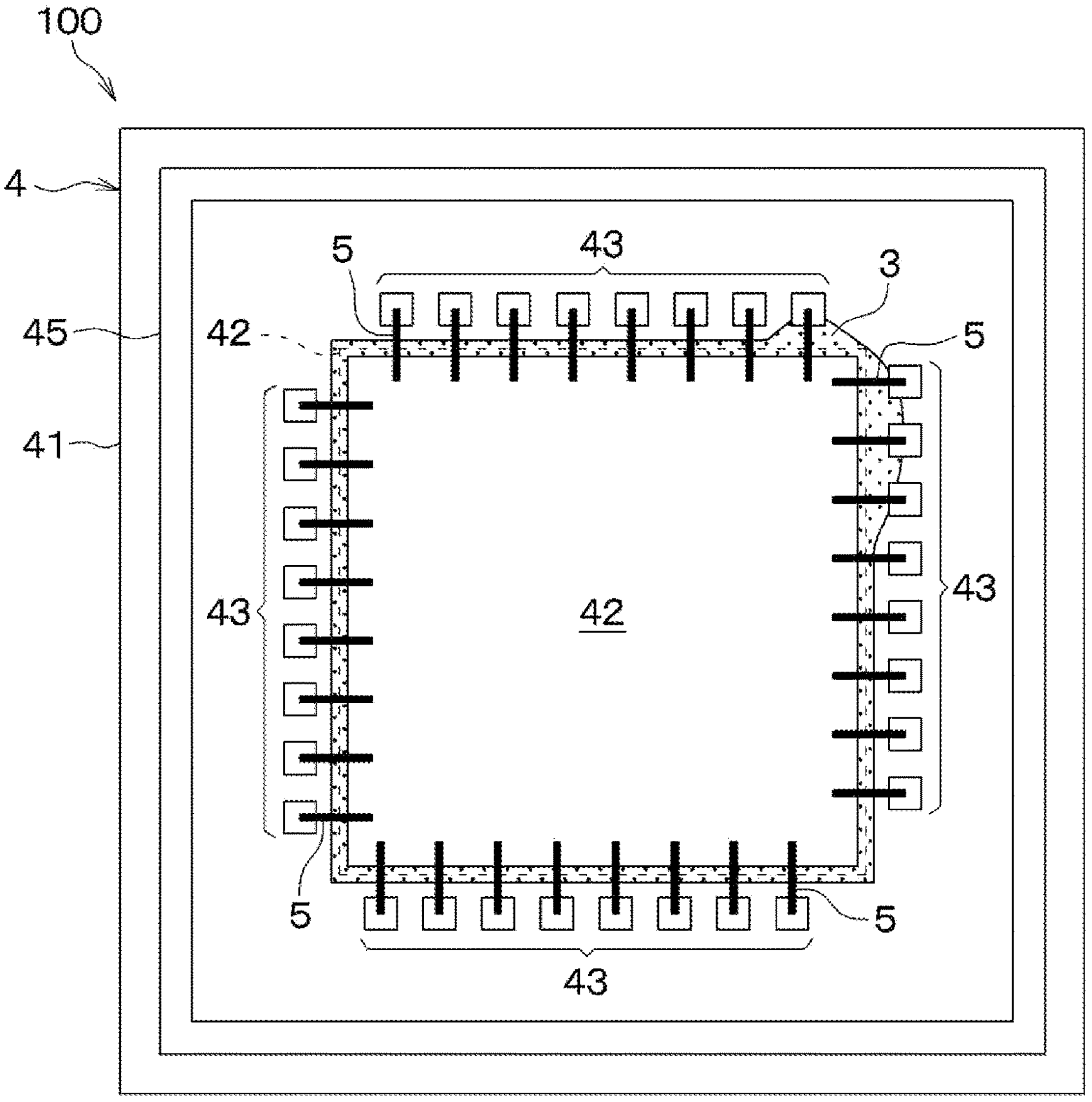
FIG. 4 is a plan view of a semiconductor device of a comparative example for explaining an occurrence of a short circuit due to a surplus of a solder joining material.
Figure 5:
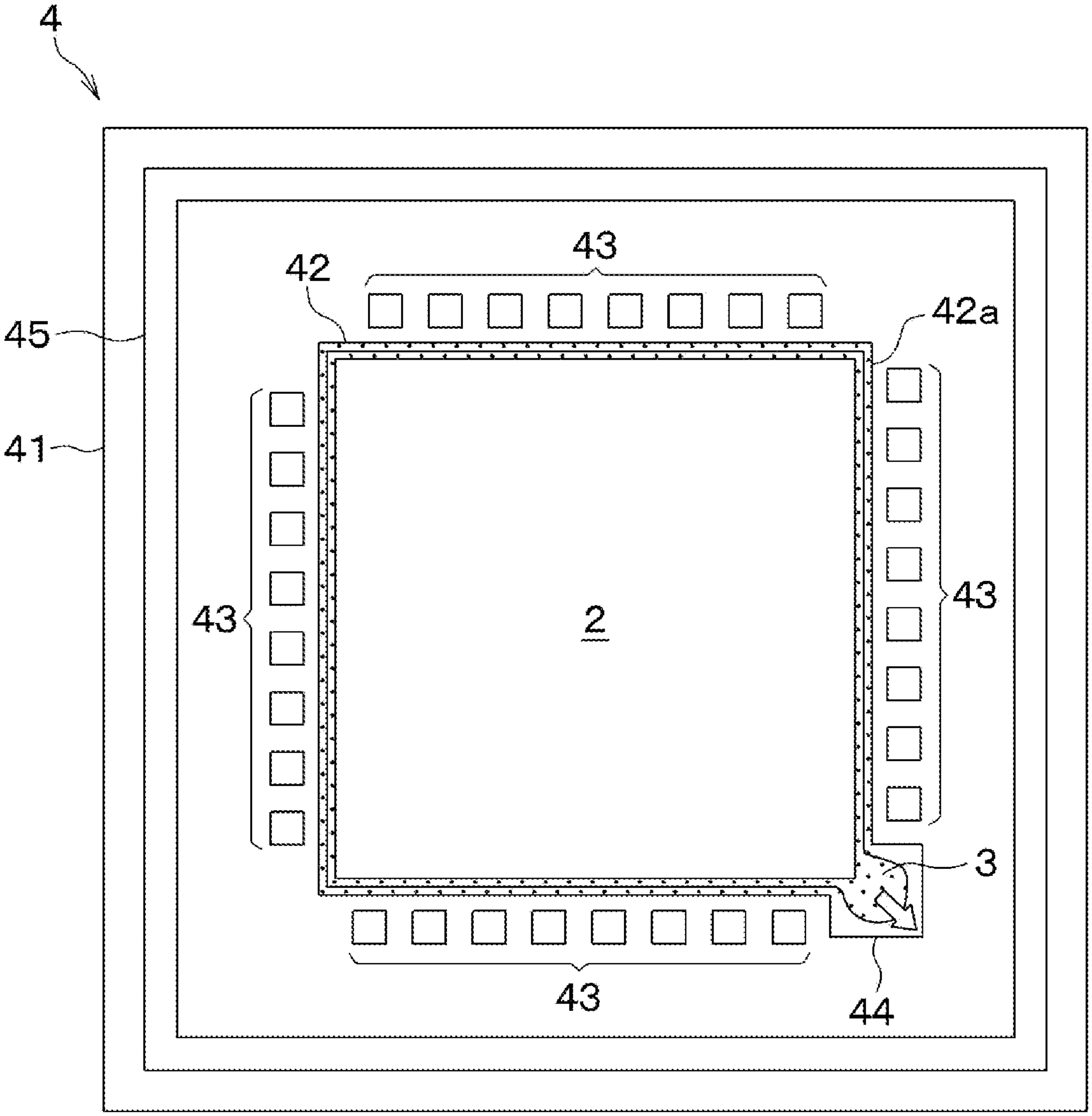
FIG. 5 is a plan view of the semiconductor device of the first embodiment for explaining an effect of suppressing a short circuit by a solder absorption portion.

Note that FIG. 4 is a plan view of a semiconductor device 100 of a comparative example with respect to the first embodiment. Although FIG. 4 is not a cross-sectional view, a solder joining material 3 is indicated with hatching in order to ease understanding of overflowing of a surplus of the solder joining material 3 in the semiconductor device 100. In addition, in FIG. 4, a cover member 6 is not illustrated. In FIG. 5, a white arrow indicates a direction in which the surplus of the solder joining material 3 wets and spreads onto a solder absorption portion 44, which will be described later.

As shown in FIG. 1, the semiconductor device 1 of the present embodiment, for example, includes a semiconductor element 2, the solder joining material 3, a substrate 4, wires 5, the cover member 6, and a heat dissipation member 7. In the semiconductor device 1, the semiconductor element 2 is joined to the substrate 4 with the solder joining material 3. In addition, the semiconductor element 2 is connected to the substrate 4 through the multiple wires 5. For example, the semiconductor device 1 is an optical semiconductor device in which the semiconductor element 2 is an optical semiconductor element, and is configured to emit light to the outside or receive light from the outside in a state where the semiconductor element 2 and a region of the substrate 4 including connecting portions with the wires 5 are covered with and sealed with the cover member 6.

In the present disclosure, a case where the semiconductor device 1 is configured as an optical semiconductor device will be described as a representative example. However, the semiconductor device 1 of the present disclosure is not limited to the described configuration.

The semiconductor element 2 has, for example, a plate-like shape having a first surface 2*a* and a second surface 2*b* that are opposite to each other in a direction normal to the first surface 2*a*, that is, in a thickness direction of the semiconductor element 2. The semiconductor element 2 is, for example, produced by a known semiconductor process using a semiconductor material such as silicon (Si) or silicon carbide (SiC). The semiconductor element 2 is, for example, an optical semiconductor element that has a plurality of electrodes 21 and a laser diode 22 on the first surface 2*a*, and is configured to emit a laser light of a predetermined wavelength to the outside. For example, the semiconductor element 2 may include a light receiving portion (not shown), and be configured to receive reflected light of the laser light emitted to the outside, and output a signal corresponding to the amount of the light received. The second surface 2*b* of the semiconductor element 2 is joined to an element mount portion 42 of the substrate 4 with the solder joining material 3. For example, the wires 5 are connected to the electrodes 21 and the laser diode 22 on the first surface 2*a* of the semiconductor element 2, and the semiconductor element 2 is thus electrically connected to the bonding portions 43 of the substrate 4 via the wires 5.

The electrodes 21 are made of, for example, a conductive material such as aluminum (Al). The electrodes 21 are, for example, formed by a vacuum process such as vapor deposition. For example, the electrodes 21 are arranged apart from each other on the first surface 2*a*, and different wires 5 are independently connected to the electrodes 21 by wire bonding.

Although not shown, the laser diode 22 includes, for example, an N-type region, a P-type region and a light-emitting layer, and thus has a double hetero structure in which the light emitting layer is interposed between the N-type region and the P-type region. When being applied with a voltage through the wire 5, the laser diode 22 generates the laser light of a predetermined wavelength. The laser light generated by the laser diode 22 is emitted outside from the first surface 2*a* through a light guide path (not shown) of the semiconductor element 2, for example. The material of the light emitting layer of the laser diode 22 is, for example, InGaN having a wavelength of 400 nm to 530 nm, AlGaInP having a wavelength of 635 nm to 680 nm, AlGaAs having a wavelength of 780 nm to 850 nm, or the like. The material of the light emitting layer of the laser diode 22 can be changed as appropriate according to the wavelength of the laser light. In addition, the laser diode 22 is not limited to these examples about the constituent material when generating visible light. The laser diode 22 may be configured to generate infrared light with a wavelength of 900 nm or more.

The solder joining material 3 is made of a joining material containing tin (Sn) as a main component, and is used for joining constituent members of the semiconductor device 1. The solder joining material 3 is, for example, made of tin-silver (SnAg), tin-copper (SnCu), or tin-silver-copper (SnAgCu). However, the solder joining material 3 is not limited to these examples.

Figure 2:
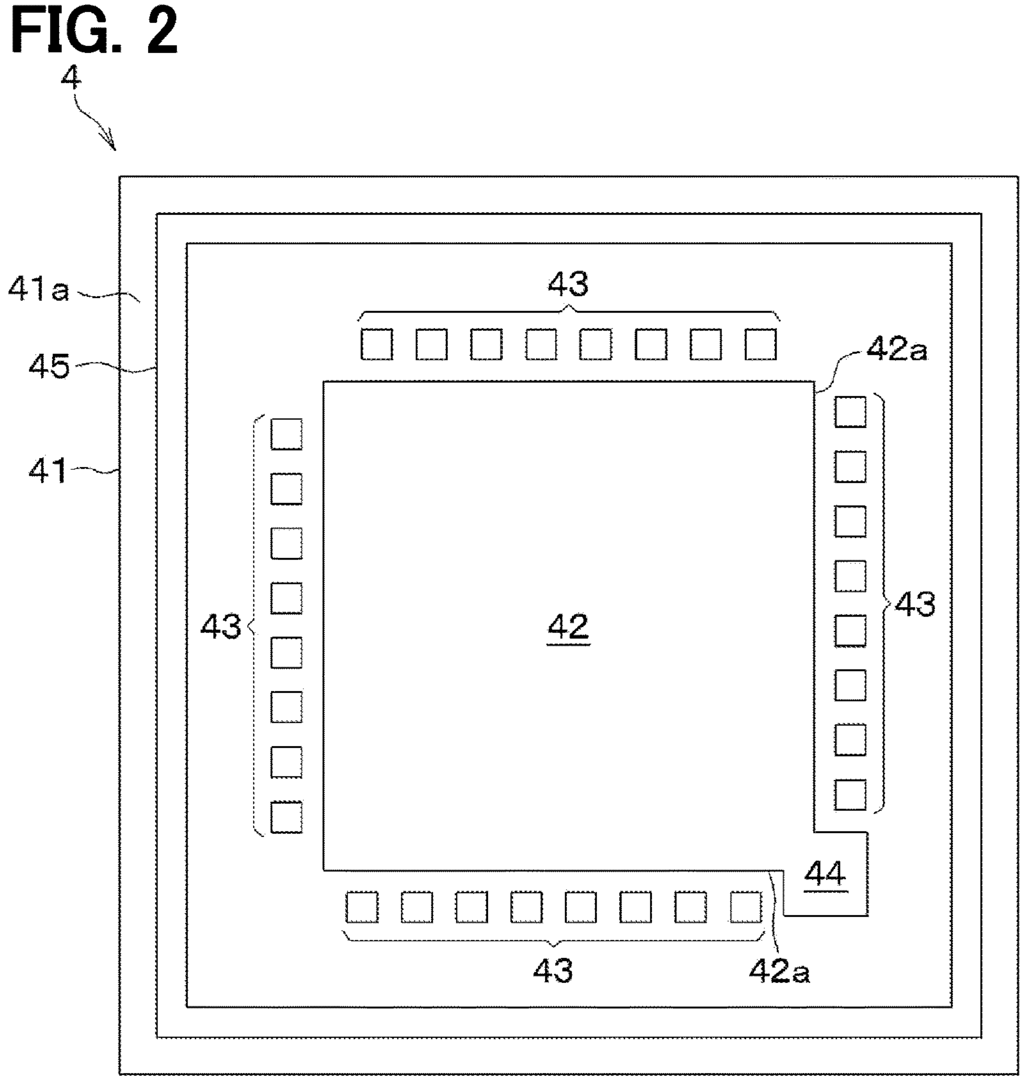
FIG. 2 is a plan view of a substrate of the semiconductor device on which a semiconductor element is mounted.

As shown in FIGS. 1 and 2, for example, the substrate 4 includes a base 41, an element mount portion 42, a plurality of bonding portions 43, a solder absorption portion 44, and a cover mount portion 45. For example, the substrate 4 has the element mount portion 42, the plurality of bonding portions 43, the solder absorption portion 44, and the cover mount portion 45 on a front surface 41*a* of the base 41, and a heat dissipation member 7 is bonded to a rear surface 41*b* of the base 41 with an adhesive or the like (not shown). Note that, on the substrate 4, other electronic components or the like may be mounted on a region outside the cover member 6.

For example, the base 41 is made of an insulating ceramic material such as alumina or alumina zirconia. As another example, the base 41 may be made of another insulating material such as glass epoxy resin.

The element mount portion 42 is a portion onto which the semiconductor element 2 is mounted through the solder joining material 3 and has a shape matching the outer shape of the semiconductor element 2. The element mount portion 42 has, for example, a substantially quadrilateral shape (four-sides shape) such as a rectangle or square, and all of the sides forming the outline of the element mount portion 42 face the bonding portions 43. Hereinafter, for convenience of explanation, the side that forms the outline of the element mount portion 42 and faces the bonding portions 43 is referred to as the "facing side 42*a*". In the example shown in FIG. 2, all the four sides forming the outline of the element mount portion 42 are the facing sides 42*a*. However, the element mount portion 42 is not limited to this example. The shape of the element mount portion 42 is not limited to the substantially quadrilateral shape, and may be a polygonal shape having plural sides forming an outline. Further, the shape of the element mount portion 42 can be changed according to the outline of the semiconductor element 2.

Figure 3:
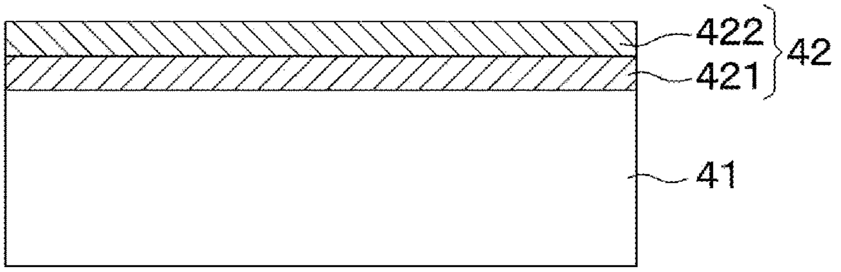
FIG. 3 is a cross-sectional view showing a configuration example of an element mount portion of the substrate.

The solder absorption portion 44 extends from at least an end of one or more facing sides 42*a* of the element mount portion 42, the end being located outside of a region facing the bonding portions 43. The element mount portion 42 and the solder absorption portion 44 are configured to have a higher solder wettability than another portion of the substrate 4. For example, as shown in FIG. 3, the element mount portion 42 has a laminated structure in which a metal film 422 having high solder wettability is disposed on a conductive portion 421 made of a conductive material such as Cu or an alloy of the conductive material. Here, "high solder wettability" refers to a state in which the contact angle of solder is smaller than that of Cu (contact angle: about 43°).

The metal film 422 has an outermost surface made of a metal material such as gold (Au), which has high solder wettability. For example, the metal film 422 may have one of a single film structure composed of an Au single film, a laminated film structure composed of nickel (Ni) and gold (Au), or a laminated film structure composed of nickel (Ni) and palladium (Pd) and gold (Au). In the laminated film structure, respective films are disposed in the stated order from the base 41 side. In other words, the gold film forms an outermost layer of the metal film 422. However, the structure and the material of the metal film 422 are not particularly limited to these examples.

The bonding portion 43 is a portion to which the wire 5 is connected. The bonding portion 43 is, for example, made of a conductive material such as Cu or Au. The multiple bonding portions 43 are, for example, arranged apart from each other while surrounding the element mount portion 42, and are electrically independent of the element mount portion 42 and the solder absorption portion 44. The bonding portion 43 is connected to the wire 5 by wire bonding, and is also connected to a circuit wiring (not shown) of the substrate 4.

The solder absorption portion 44 is a member integral with the element mount portion 42, and serves to absorb a surplus of the solder joining material 3 placed on the element mount portion 42. The solder absorption portion 44 and the element mount portion 42 are configured to have higher solder wettability than another portion of the substrate 4.

For example, FIG. 4 shows a semiconductor device 100 without having a solder absorption portion 44, as a comparative example to the present embodiment. In the semiconductor device 100 of the comparative example, if the amount of the solder joining material 3 placed on the element mount portion 42 is excessive, the surplus of the solder joining material 3 has nowhere to go and thus overflows from the element mount portion 42. If the solder joining material 3 overflows, the element mount portion 42 and the bonding portions 43 to which the wires 5 are connected are likely to be electrically connected through the solder joining material 3, resulting in a short circuit.

On the other hand, in a case where the substrate 4 having the solder absorption portion 44 is used, the surplus of the solder joining material 3 on the element mount portion 42 wets and spreads over the solder absorption portion 44 having the relatively high solder wettability. That is, the surplus of the solder joining material 3 preferentially wets and spreads onto the solder absorption portion 44 as indicated by the white arrow in FIG. 5. Thus, the solder absorption portion 44 functions to suppress the surplus of the solder joining material 3 from overflowing to a region outside the element mount portion 42. As a result, it is possible to suppress the occurrence of the short circuit due to the solder joining material 3 overflowing from the element mount portion 42 and wetting and spreading to the bonding portions 43 arranged therearound.

Figure 6:
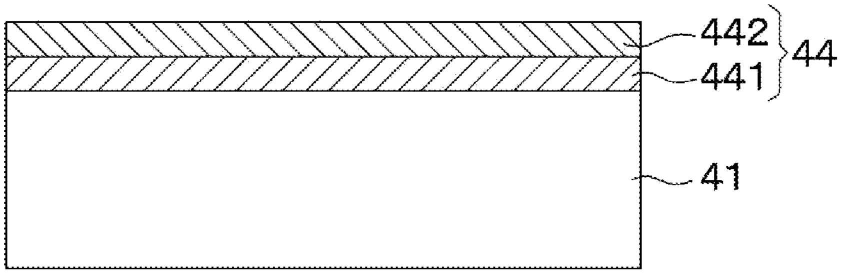
FIG. 6 is a cross-sectional view showing a configuration example of a solder absorption portion of the substrate.

The solder absorption portion 44 has the same configuration as the element mount portion 42, that is, includes a laminated structure in which a metal film 442 is laminated on a conductive portion 441, as shown in FIG. 6. The solder absorption portion 44 is formed, for example, by electroplating or electroless plating at the same time as the element mount portion 42 is formed. The conductive portion 441 is made of the same conductive material as the conductive portion 421. The metal film 442 is made of a conductive material similar to that of the metal film 422 and has a structure of a single film or a laminated film.

In the case where the element mount portion 42 has the multiple facing sides 42*a*, as shown in FIG. 2, the solder absorption portion 44 is provided on at least one facing side 42*a*. The substrate 4 may have only one solder absorption portion 44 with respect to the element mount portion 42.

Figure 7:
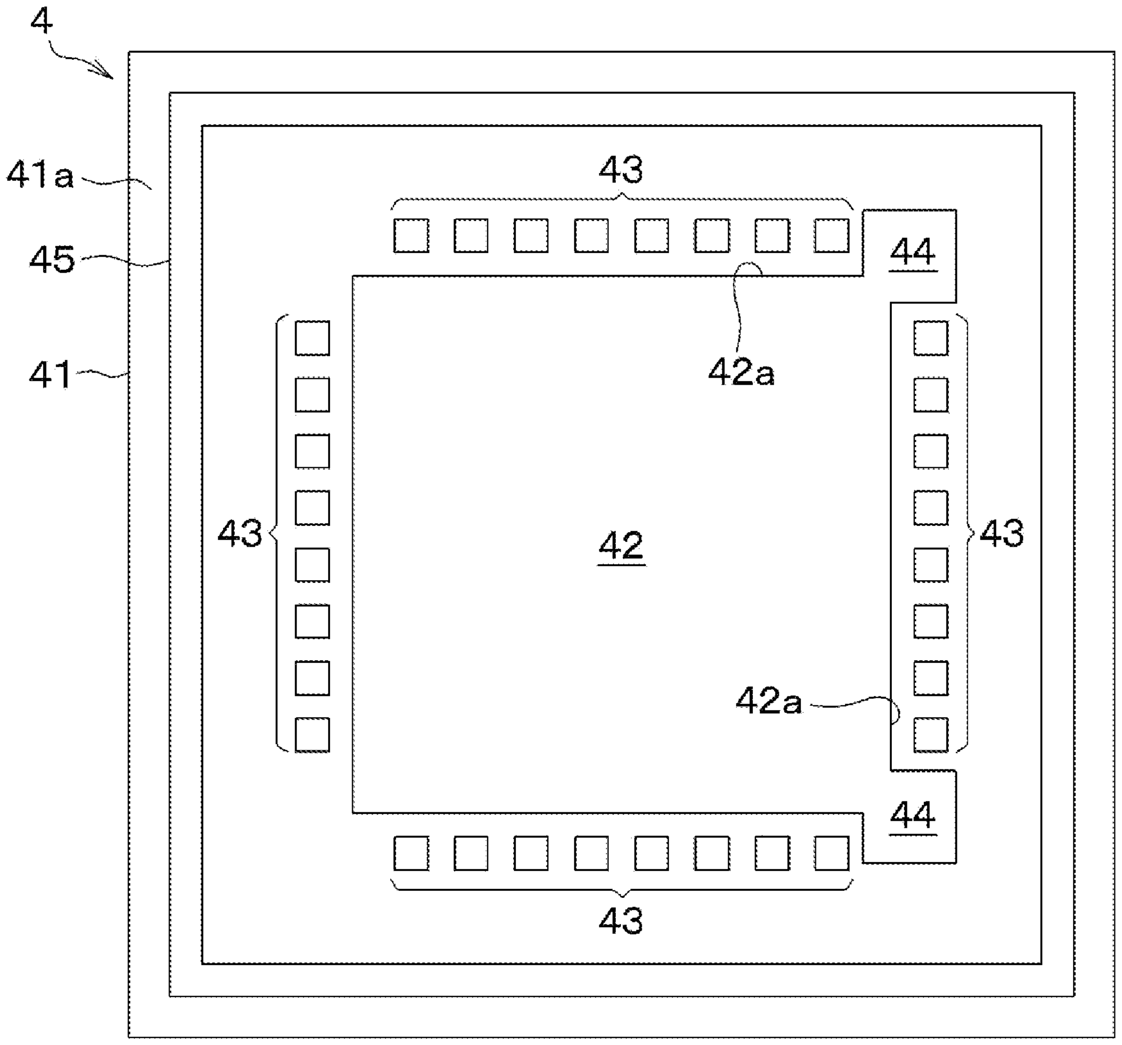
FIG. 7 is a plan view showing another arrangement example of the solder absorption portion in the semiconductor device according to the first embodiment.
Figure 8:
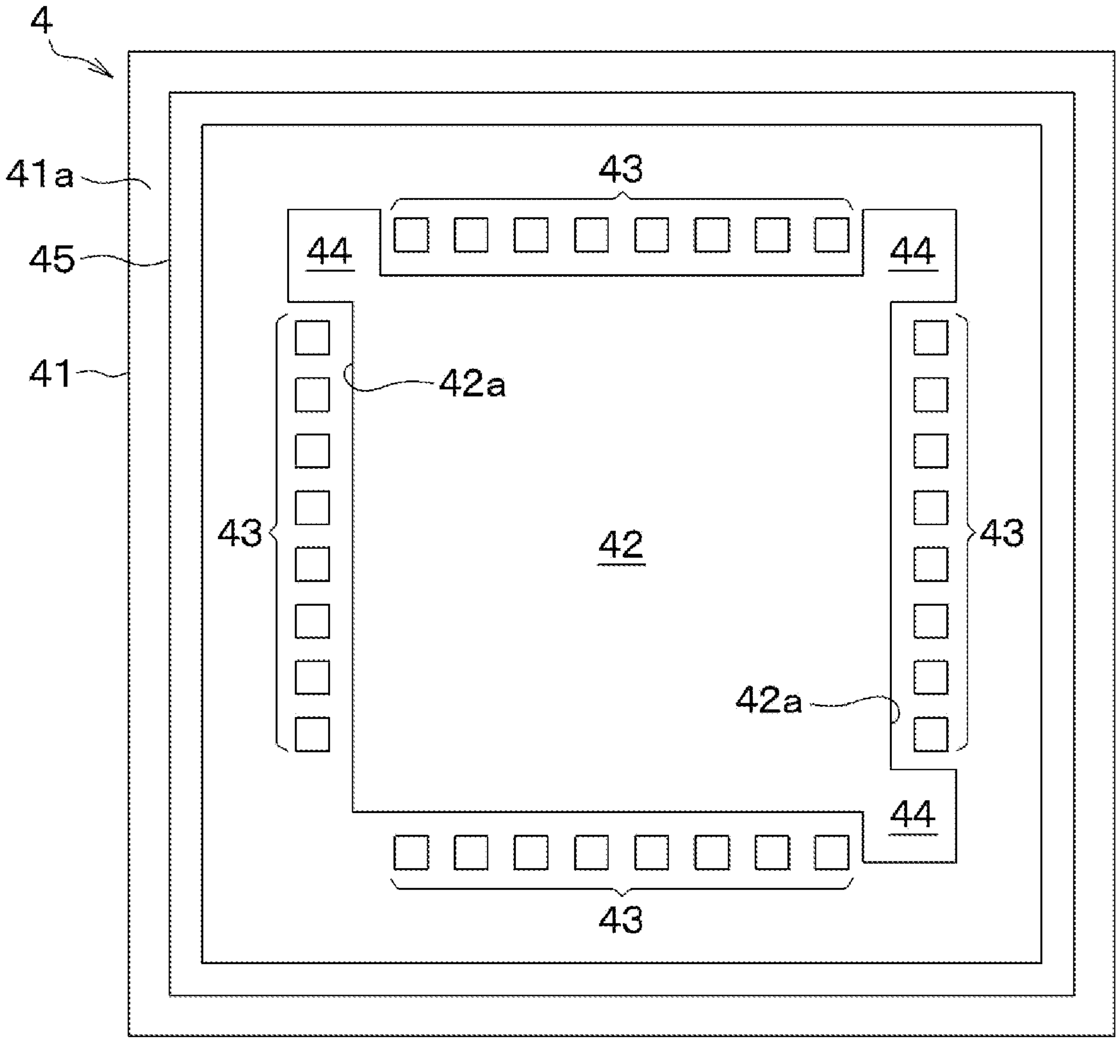
FIG. 8 is a plan view showing further another arrangement example of the solder absorption portion in the semiconductor device according to the first embodiment.
Figure 9:
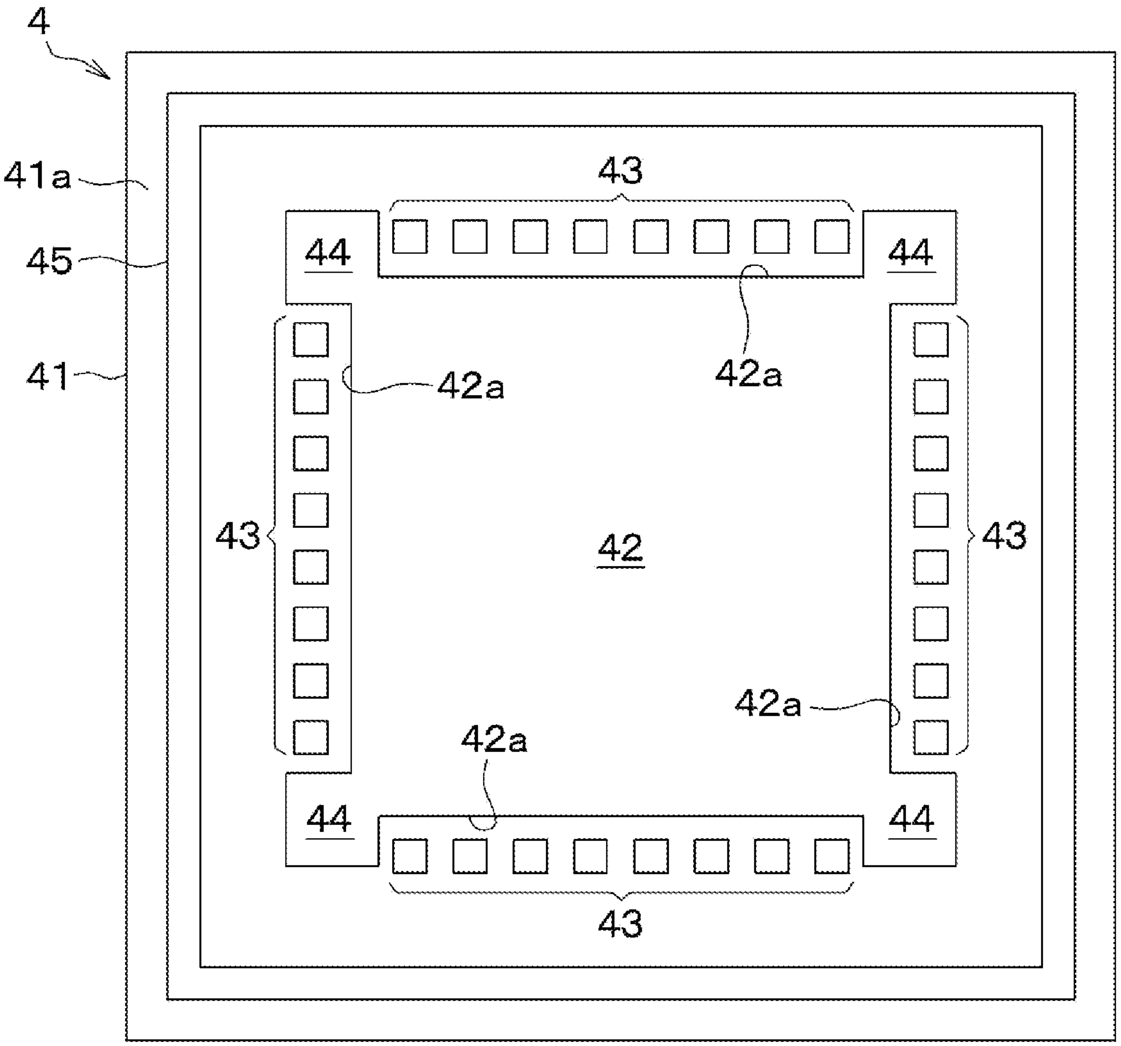
FIG. 9 is a plan view showing still another arrangement example of the solder absorption portion in the semiconductor device according to the first embodiment.

Alternatively, the substrate 4 may have multiple solder absorption portions 44, such as two, three, or four, as shown in FIGS. 7 to 9. In the case where the multiple solder absorption portions 44 are provided to the element mount portion 42, the arrangements of the multiple solder absorption portions 44 are not particularly limited as long as the solder absorption portion 44 is provided in a region outside of a part of the facing side 42*a* facing one or more bonding portions 43. In other words, at least one solder absorption portion 44 is provided at one of the multiple corners of the element mount portion 42, the one of the multiple corners being adjacent to at least one facing side 42*a*.

The cover mount portion 45 is a portion to which the cover member 6 is mounted with the solder joining material 3 or the like. The cover mount portion 45 is arranged in a region outside the element mount portion 42 and the multiple bonding portions 43 provided on the periphery of the element mount portion 42. The cover mount portion 45 has a frame-like shape surrounding the element mount portion 42 and the multiple bonding portions 43. The cover mount portion 45 has, for example, the same configuration as the element mount portion 42 or the bonding portions 43, and is formed by electrolytic plating or electroless plating.

The wire 5 is made of a conductive material such as Au, for example. The wire 5 is connected to the semiconductor element 2 and to the bonding portion 43 by wire bonding so as to electrically connect the semiconductor element 2 and the bonding portion 43.

For example, as shown in FIG. 1, the cover member 6 is a box-shaped member, and forms a closed space that covers the area where the semiconductor element 2 and the wires 5 are connected, when mounted on the cover mount portion 45. The cover member 6 may also be referred to as a "lid". Since the semiconductor device 1 is configured to emit the laser light from the semiconductor element 2 to the outside, the cover member 6 has a light transmission portion 61 at a part of a top wall located above the first surface 2*a* of the semiconductor element 2 so as to allow the laser light to transmit. The cover member 6 is, for example, a metal lid having a base made of a metal material such as an alloy of iron (Fe) and Ni, and the light transmission portion 61 is attached to a recessed portion of the cover member 6. The light transmission portion 61 is made of a light-transmitting material such as glass. The closed space provided by the cover member 6 being attached to the cover mount portion 45 has an inert gas atmosphere such as nitrogen ($N_2$).

The heat dissipation member 7 is, for example, a heat sink. The heat dissipation member 7 is attached to the rear surface 41*b* of the base 41 with an adhesive (not shown) or the like. The heat dissipation member is a member that dissipates heat of the semiconductor element 2 transferred to the base 41 to the outside. The heat dissipation member 7 has, for example, a shape having a large number of fins of arbitrary shape.

The semiconductor device 1 of the present embodiment has the basic configuration as described above.

In the semiconductor device 1 of the present embodiment, the substrate 4 has the solder absorption portion 44 extending from the element mount portion 42. Even if the amount of the solder joining material 3 is excessive, the surplus of the solder joining material 3 preferentially wets and spreads over the solder absorption portion 44 when the semiconductor element 2 is mounted on the element mount portion 42. As a result, the surplus portion of the solder joining material 3 is suppressed from overflowing to a region outside the element mount portion 42 and from contacting the bonding portions 43, which are connected to the semiconductor element 2 by the wire 5. Namely, an occurrence of the short circuit due to the solder joining material 3 can be suppressed. The solder absorption portion 44 is arranged outside the part of the facing side 42*a* of the element mount portion 42, the part facing the bonding portions 43. Therefore, the distance between the semiconductor element 2 and the bonding portion 43 is not increased and the wire length can be shortened. In addition, the semiconductor device 1 does not have a recess in the region directly below the semiconductor element 2. Therefore, the thickness of the solder joining material 3 that joins the semiconductor element 2 and the element mount portion 42 is smaller, as compared to a configuration of having such a recess. As a result, an increase in thermal resistance can be suppressed. Therefore, the semiconductor device 1 of the present embodiment has the effects of suppressing a short circuit caused by the solder joining material 3 when the semiconductor element 2 is mounted on the substrate 4, suppressing an increase in wire length, and suppressing an increase in thermal resistance by the solder joining material 3.

Second Embodiment

A semiconductor device 1 according to a second embodiment will be described with reference to FIGS. 10 to 13.

Figure 10:
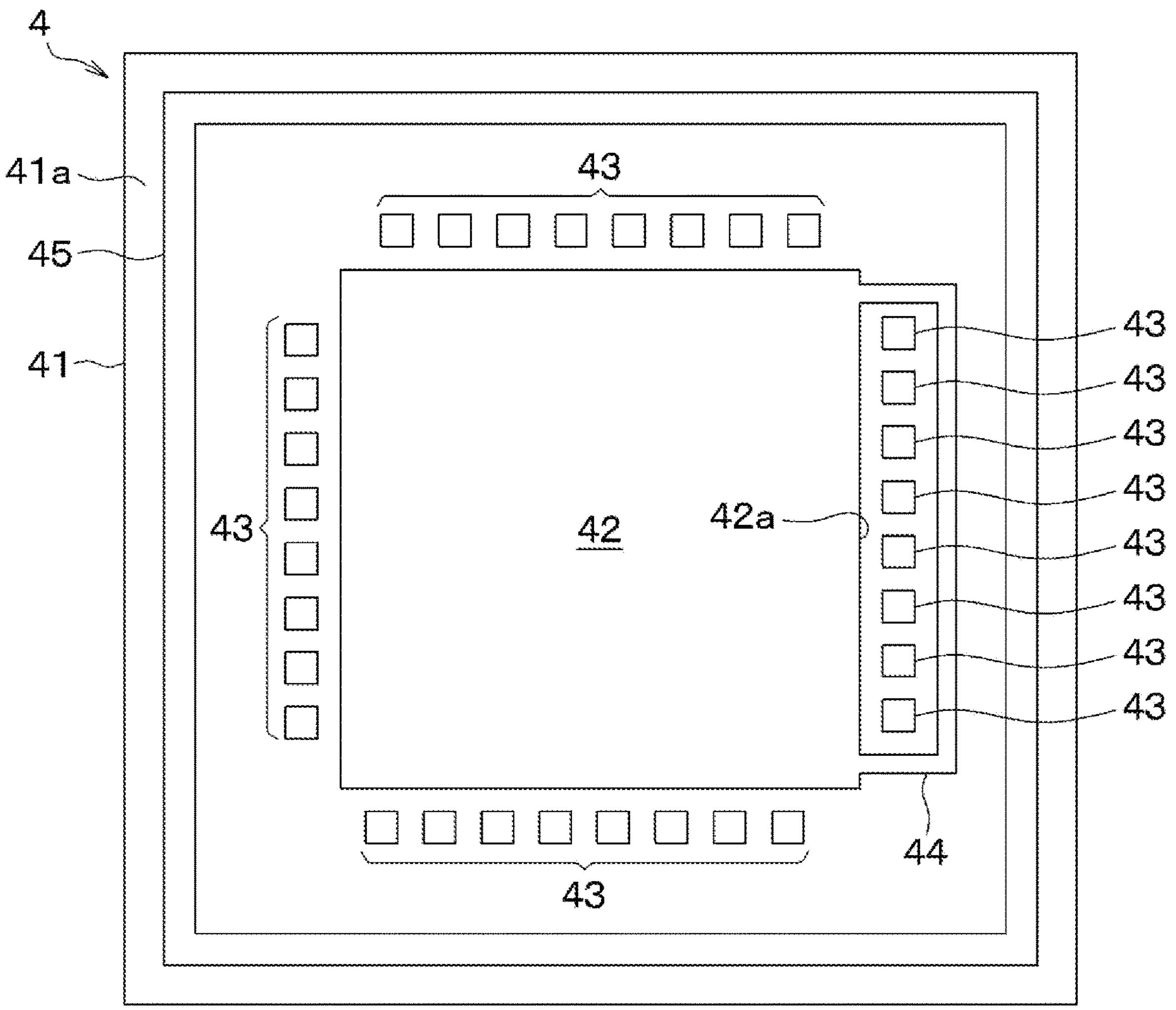
FIG. 10 is a plan view showing an arrangement example of a solder absorption portion in a semiconductor device according to a second embodiment.

The semiconductor device 1 of the present embodiment is different from the semiconductor device 1 of the first embodiment because the shape of the solder absorption portion 44 is changed from that the first embodiment, as shown in FIG. 10, for example. Hereinafter, the difference of the solder absorption portion 44 from the first embodiment will be mainly described.

Figure 11:
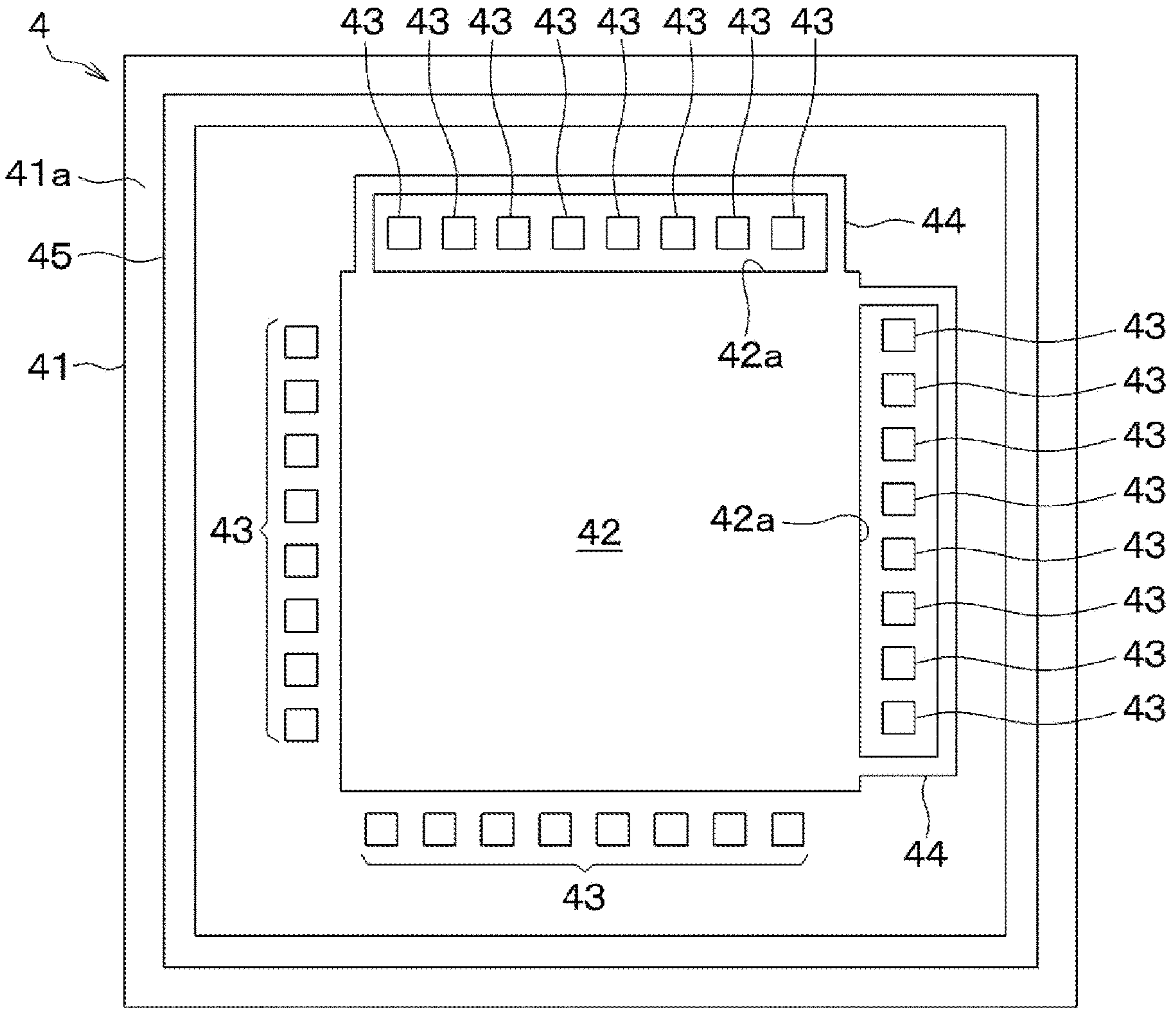
FIG. 11 is a plan view showing another arrangement example of the solder absorption portion in the semiconductor device according to the second embodiment.
Figure 12:
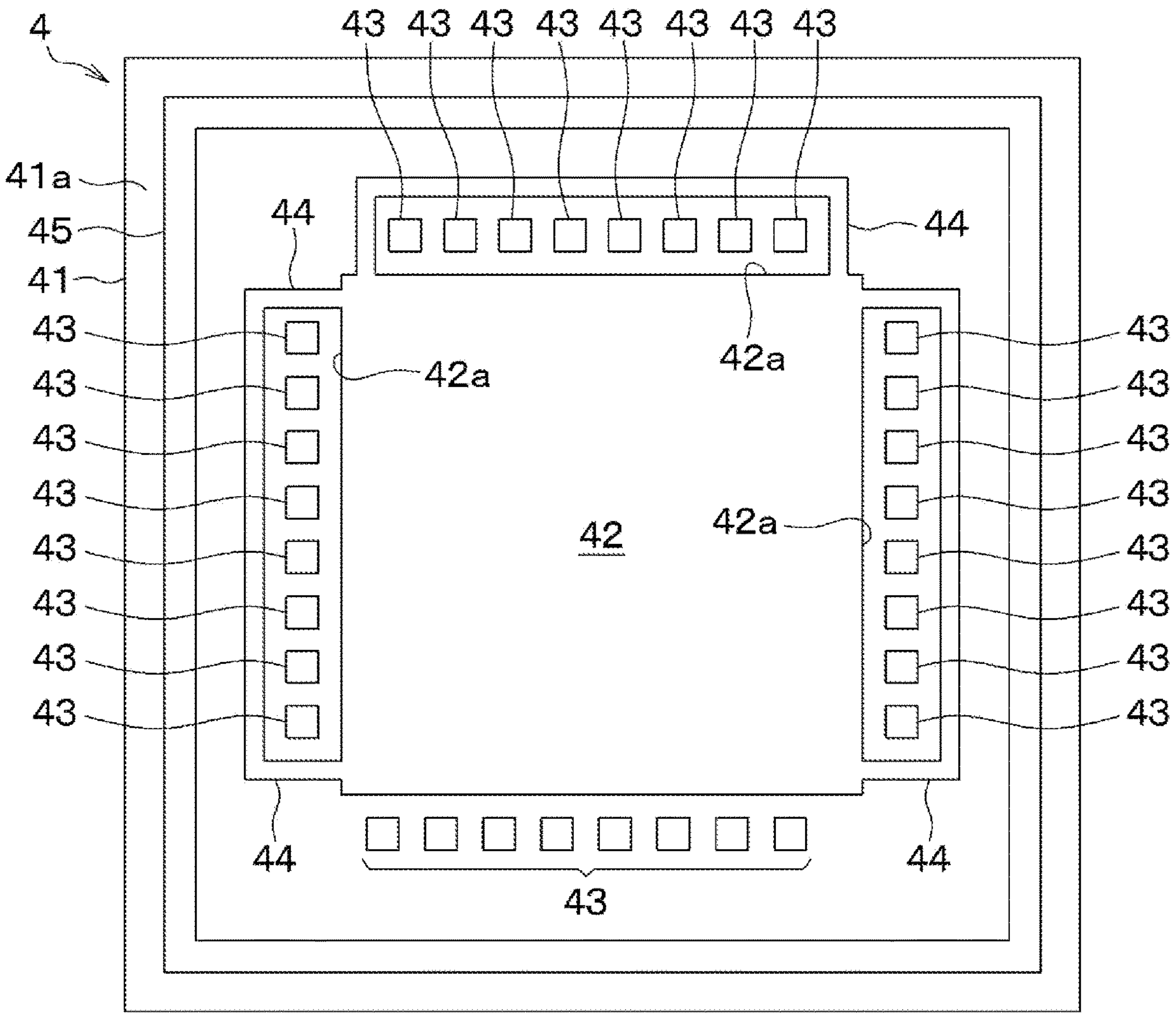
FIG. 12 is a plan view showing further another arrangement example of the solder absorption portion in the semiconductor device according to the second embodiment.
Figure 13:
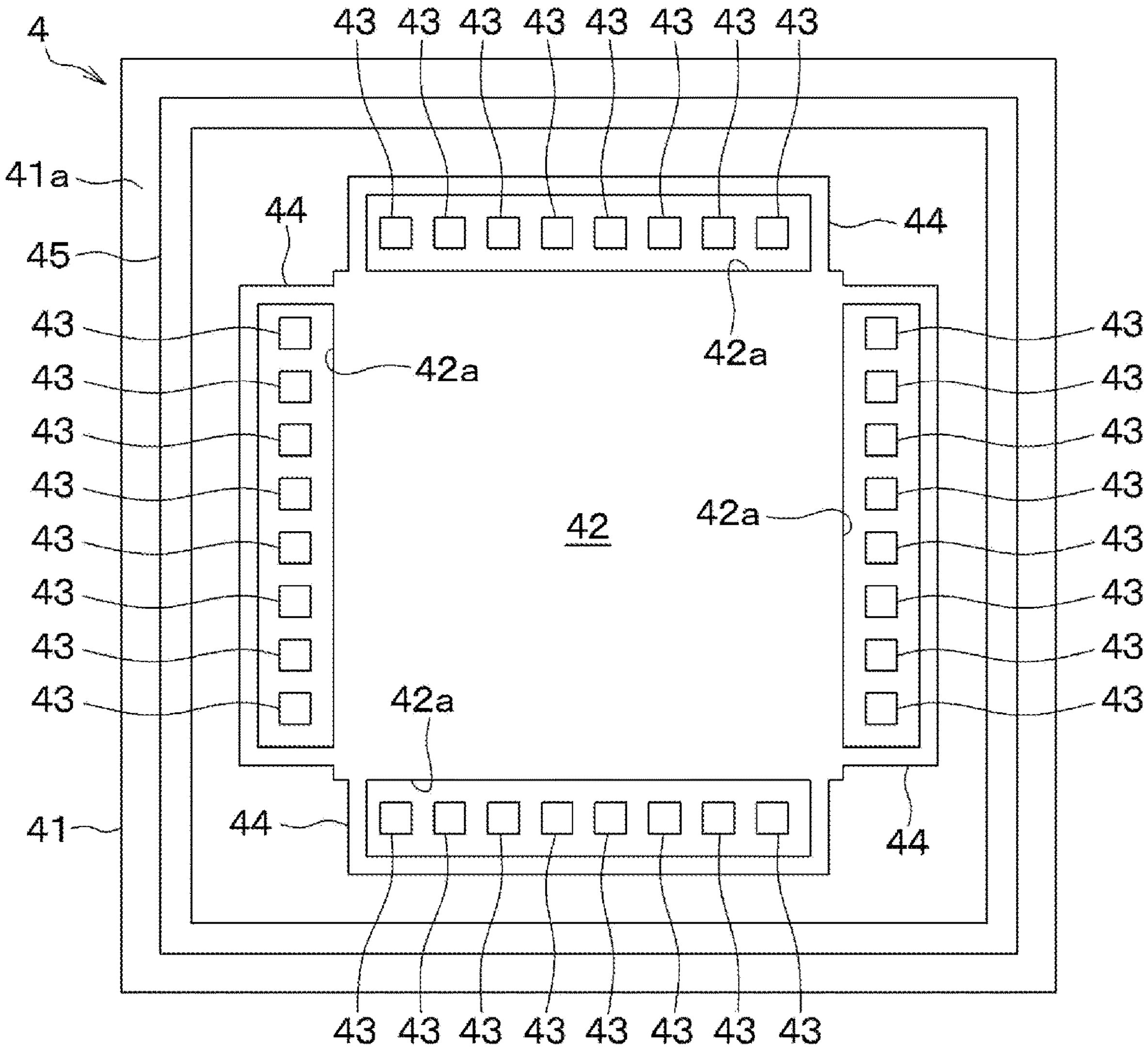
FIG. 13 is a plan view showing still another arrangement example of the solder absorption portion in the semiconductor device according to the second embodiment.

In the present embodiment, the solder absorption portion 44 has side portions extending from opposite ends of the facing side 42*a*, and a connecting portion connecting between the side portions. The connecting portion is located between the bonding portions 43 and the cover mount portion 45. Thus, the solder absorption portion 44 has a frame shape surrounding the multiple bonding portions 43 together with the element mount portion 42. The semiconductor device 1 may have only one solder absorption portion 44 with respect to the element mount portion 42, or may have multiple solder absorption portions 44 with respect to the element mount portion 42, such as two, three, or four as shown in FIGS. 11 to 13. Even in the configuration where the element mount portion 42 has a substantially quadrilateral outer shape and the bonding portions 43 are arranged so as to surround all four sides of the element mount portion 42 on the substrate 4, it is not always necessary that the solder absorption portion 44 is provided for all the four sides. The number of the solder absorption portion 44 can be changed as appropriate.

Also in the present embodiment, the semiconductor device 1 achieves advantageous effects similar to those of the first embodiment. In addition, in the present embodiment, the solder absorption portion 44 has the frame shape that is connected to the element mount portion 42 at two locations. Therefore, the route to which the surplus of the solder joining material 3 placed on the element mounting portion 42 wets and spreads increases. As such, the effect of suppressing the overflow of the solder joining material 3 toward the bonding portions 43 is further improved.

Third Embodiment

A semiconductor device 1 according to a third embodiment will be described with reference to FIGS. 14 to 17.

Figure 14:
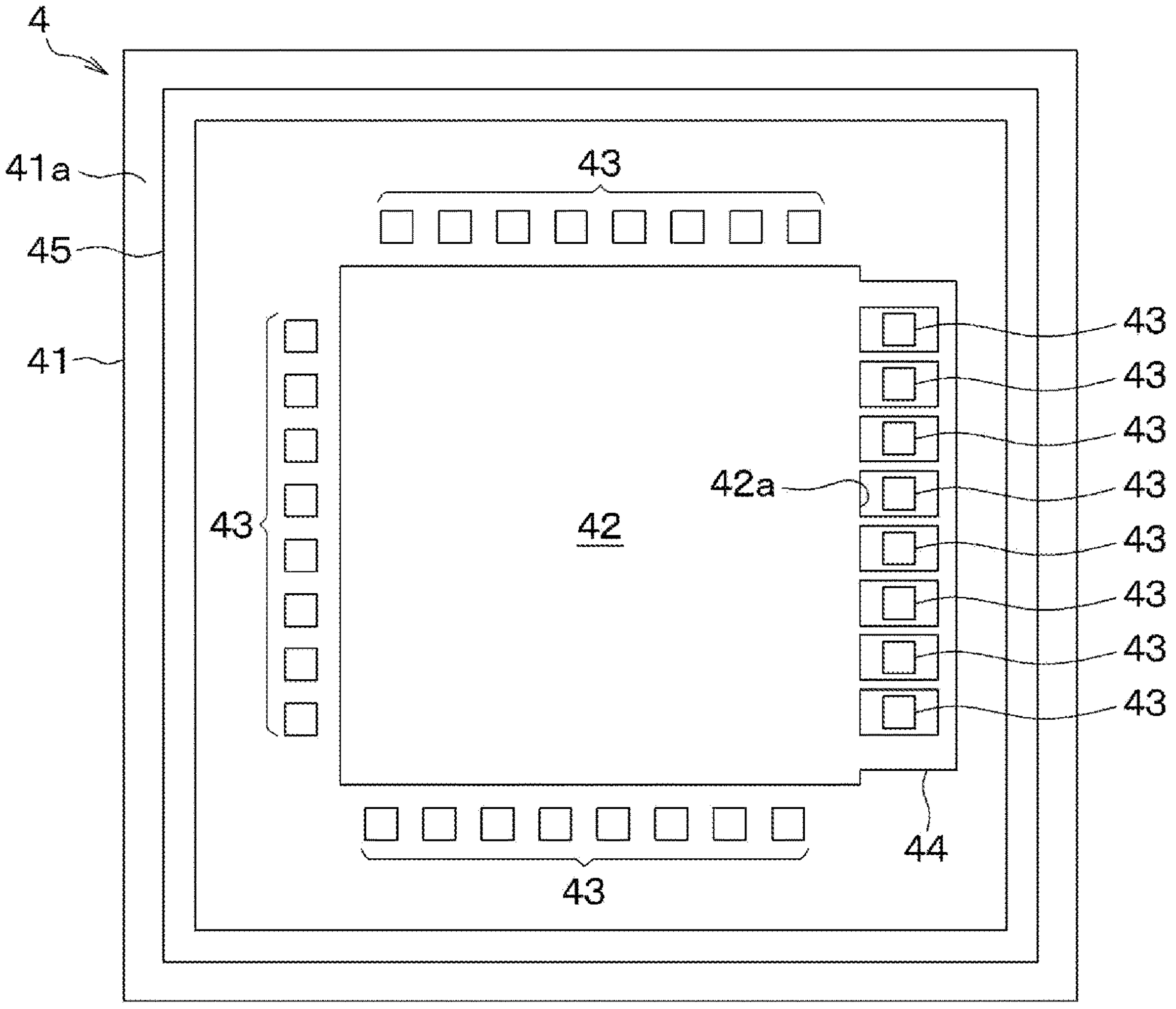
FIG. 14 is a plan view showing an arrangement example of a solder absorption portion in a semiconductor device according to a third embodiment.

The semiconductor device 1 of the present embodiment is different from the semiconductor device 1 of the first embodiment because one solder absorption portion 44 individually surrounds the multiple bonding portions 43, as shown in FIG. 14, for example. Hereinafter, the difference of the solder absorption portion 44 from the first embodiment will be mainly described.

Figure 15:
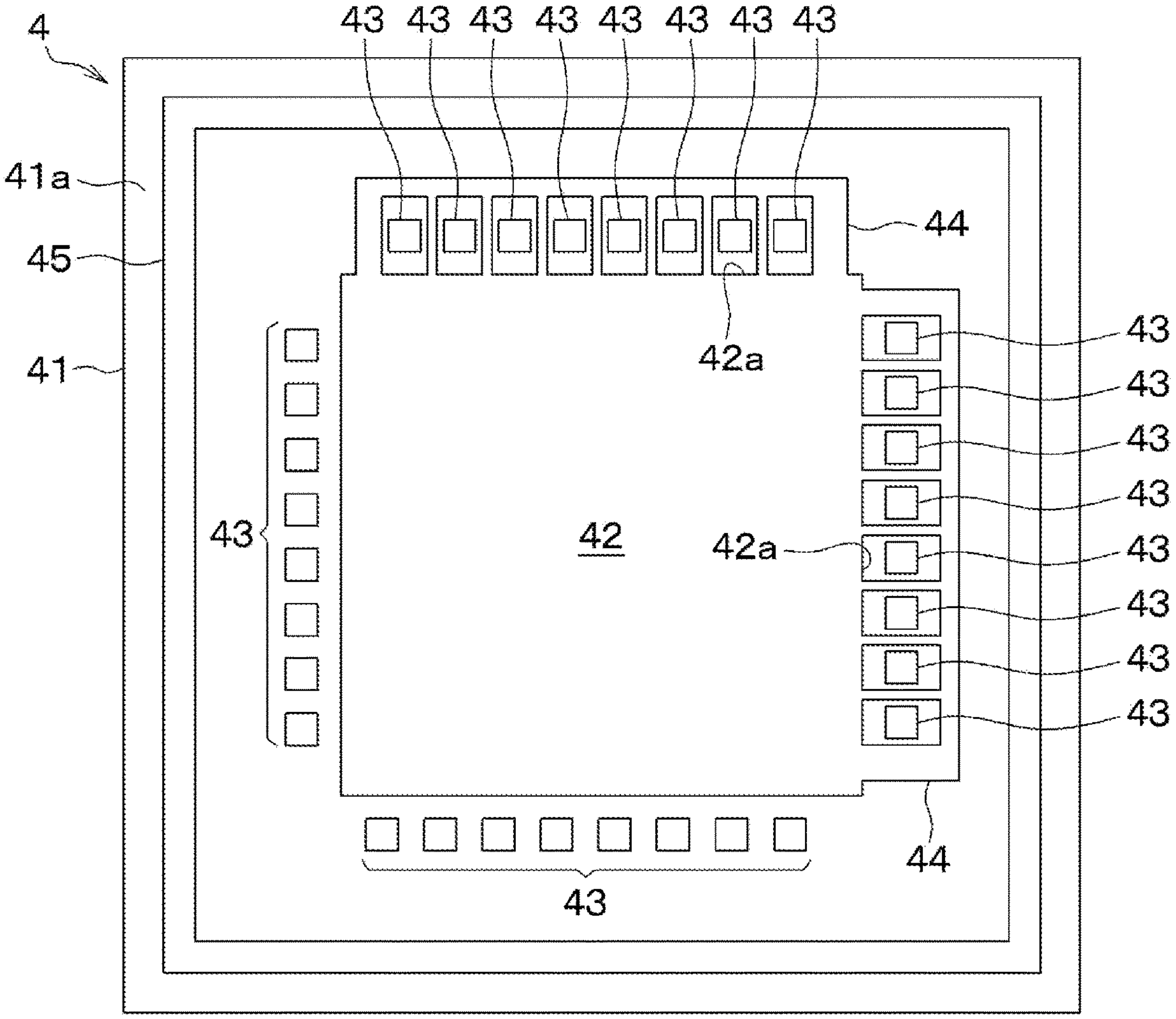
FIG. 15 is a plan view showing another arrangement example of the solder absorption portion in the semiconductor device according to the third embodiment.
Figure 16:
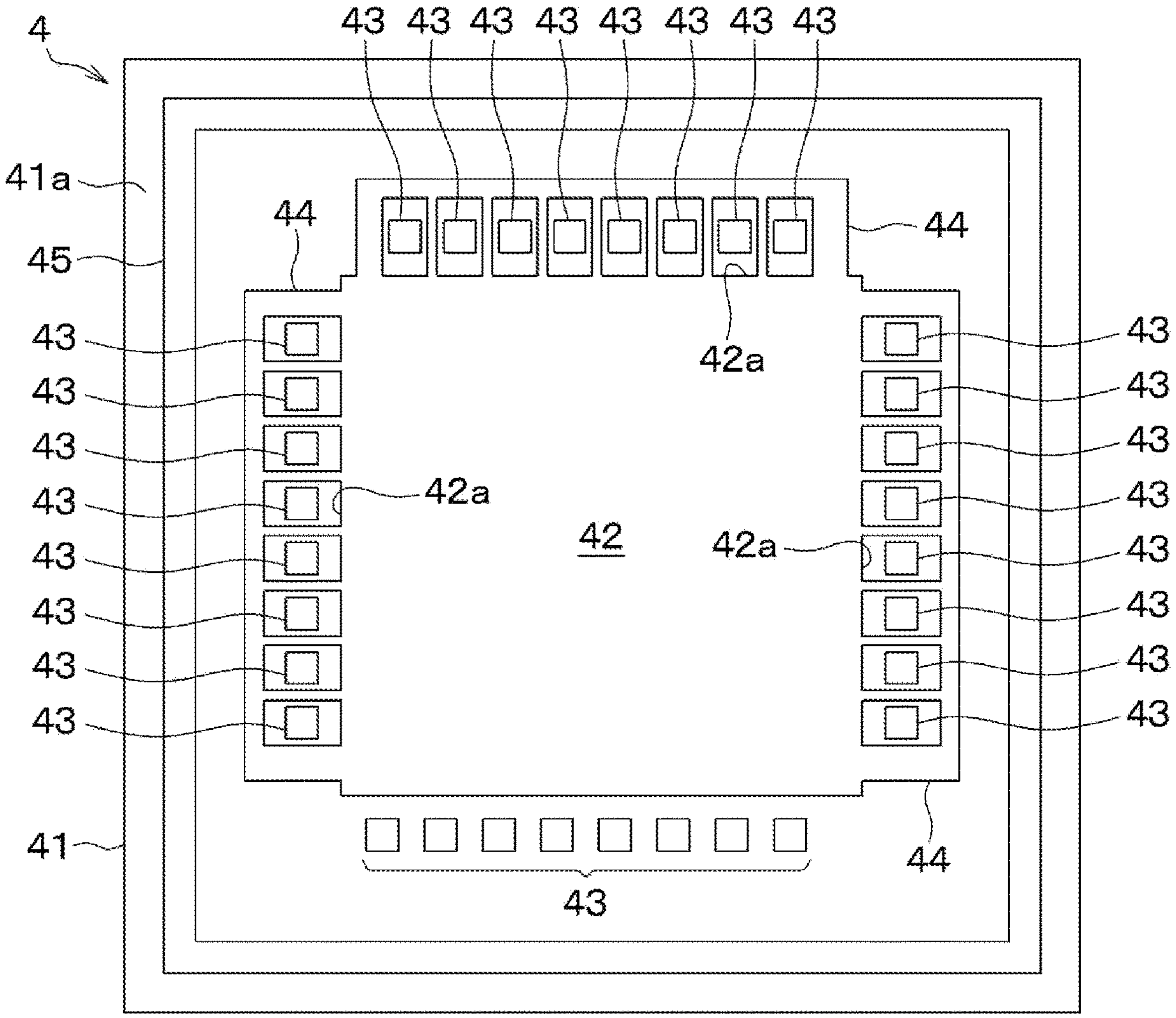
FIG. 16 is a plan view showing further another arrangement example of the solder absorption portion in the semiconductor device according to the third embodiment.
Figure 17:
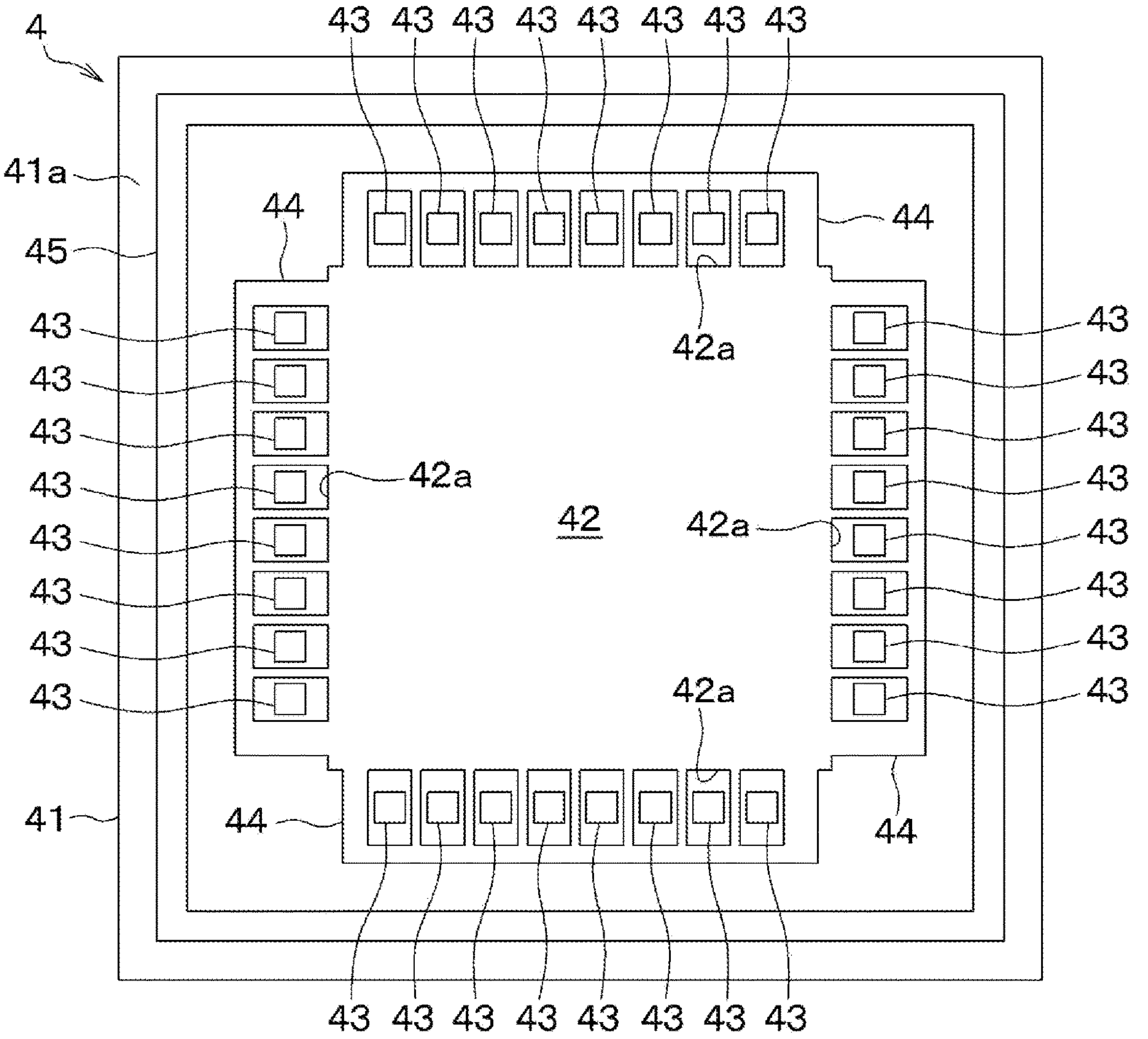
FIG. 17 is a plan view showing still another arrangement example of the solder absorption portion in the semiconductor device according to the third embodiment.

For example, as shown in FIG. 14, the solder absorption portion 44 has a frame shape surrounding the multiple bonding portions 43 together with the element mount portion 42 similar to the second embodiment. In addition to this, the solder absorption portion 44 of the present embodiment individually surrounds the bonding portions 43. That is, the solder absorption portion 44 has a lattice shape that partitions the bonding portions 43. The semiconductor device 1 may have only one solder absorption portion 44 with respect to the element mount portion 42. Alternatively, the semiconductor device 1 may have multiple solder absorption portions 44 with respect to the element mount portion 42, such as two, three, or four, as shown in FIGS. 15 to 17. The number of the solder absorption portion 44 provided for the element mount portion 42 can be appropriately changed according to the number and arrangement of the bonding portions 43 and the like.

Also in the present embodiment, the semiconductor device 1 achieves advantageous effects similar to those of the first embodiment. In addition, the solder absorption portion 44 is connected to the element mount portion 42 at multiple locations, such as three or more locations. Therefore, the route to which the surplus of the solder joining material 3 placed on the element mount portion 42 wets and spreads increases. As such, the effect of suppressing the overflow of the solder joining material 3 toward the bonding portions 43 is further improved.

OTHER EMBODIMENTS

Although the present disclosure has been made in accordance with the embodiments, it is understood that the present disclosure is not limited to such embodiments and structures. The present disclosure also encompasses various modifications and modifications within an equivalent range. Furthermore, various combinations and modes, and other combination and modes including only one, more or less element, fall within the spirit and scope of the present disclosure.

(1) In each of the embodiments described above, the structure in which the semiconductor element 2 is an optical semiconductor element and the cover member 6 surrounding the semiconductor element 2 is attached to the substrate 4 has been described as a representative example. However, the semiconductor device of the present disclosure is not limited to the example described. For example, the semiconductor device 1 has a structure in which a semiconductor element 2 other than an optical semiconductor element is connected to the substrate 4 having the solder absorption portion 44 with the solder joining material 3 and the wires 5. Further, the semiconductor device 1 may not have some of the constituent members described above. For example, the semiconductor device 1 may not have the cover member 6 or the heat dissipation member 7. In such a case, the semiconductor element 2 may have any configuration. For example, the semiconductor element 2 may include a sensor unit that outputs a signal corresponding to a physical quantity such as acceleration, angular velocity, or pressure when applied. As another example, the semiconductor element 2 may include an arbitrary integrated circuit.

(2) In each of the embodiments described above, the solder absorption portion 44 is not limited to the shapes as illustrated, and may have any other shape. The solder absorption portion 44 may have a circular shape, an elliptical shape, an elliptical frame shape, a branched shape or the like. The shape of the solder absorption portion 44 may be changed as appropriate. Moreover, the semiconductor device 1 may be configured to include two or more types of solder absorption portions 44 in any combinations of the embodiments described above.

What is claimed is:

1. A semiconductor device comprising:

a semiconductor element having a first surface and a second surface opposite to the first surface, the semiconductor element including a plurality of electrodes on the first surface;

a substrate having:

an element mount portion to which the second surface of the semiconductor element is joined through a solder joining material;

a plurality of bonding portions disposed on a periphery of the element mount portion and spaced apart from each other;

a solder absorption portion extending outwardly from the element mount portion to receive a surplus of the solder joining material and being electrically independent of the plurality of bonding portions; and a cover mount portion having a frame shape surrounding the periphery of the element mount portion and the plurality of bonding portions;

a plurality of wires connecting the plurality of electrodes and the plurality of bonding portions; and a cover member disposed on the cover mount portion of the substrate and covering the semiconductor element and the plurality of wires while being spaced from the semiconductor element and the plurality of wires, wherein the element mount portion and the solder absorption portion have a higher solder wettability than another portion of the substrate, the semiconductor element is an optical semiconductor element, the cover member has a light transmission portion that allows a light to transmit at least at a part located above the semiconductor element, the solder absorption portion includes a frame part that extends from a side of the element mount portion and surrounds at least two of the plurality of bonding portions that are disposed along the side of the element mount portion at a location between the at least two of the plurality of bonding portions and the cover mount portion while being spaced apart from the at least two of the plurality of bonding portions and the cover mount portion.

2. The semiconductor device according to claim 1, wherein the frame part further individually surrounds each of the at least two of the plurality of bonding portions together with the element mount portion.

3. The semiconductor device according to claim 1, wherein the element mount portion and the solder absorption portion each have a metal film covering a surface thereof.

4. The semiconductor device according to claim 3, wherein the metal film has one of:

a single film structure composed of a gold film;

a laminated film structure composed of a gold film and a nickel film, in which the gold film provides an outermost layer; or a laminated film structure composed of a gold film, a palladium film and a nickel film, in which the gold film provides an outermost layer and the palladium film provides a middle layer between the gold film and the nickel film.

5. The semiconductor device according to claim 1, wherein the solder joining material is made of a material containing tin as a main component.

6. The semiconductor device according to claim 1, wherein the element mount portion has a polygonal shape having a plurality of sides, including the side, forming an outline, the plurality of sides include at least one facing side facing at least one of the plurality of bonding portions, and the solder absorption portion is provided at one of ends of the at least one facing side or at both ends of the at least one facing side.

7. The semiconductor device according to claim 3, wherein the plurality of bonding portions and the cover mount portion each have a same metal film covering a surface thereof as the element mount portion and the solder absorption portion.

8. The semiconductor device according to claim 1, wherein the frame part of the solder absorption portion is connected to the side of the element mount portion at least at two positions.

9. The semiconductor device according to claim 1, further comprising a plurality of solder absorption portions including the solder absorption portion.

10. The semiconductor device according to claim 1, wherein the element mount portion has a quadrilateral outer shape having a plurality of sides including the side, further comprising at least two solder absorption portions including the solder absorption portion, the at least two solder absorption portions are provided respectively for at least two sides of the plurality of sides.

* * * * *